United States Patent [19]

Joly et al.

[11] 4,076,543
[45] Feb. 28, 1978

[54] GLASS FOR ENCAPSULATION OF DIODES

[75] Inventors: Pascal Adrien Jean Joly, Avon; Jean-Claude Alphonse Henri Prat, Maincy, both of France

[73] Assignee: Corning Glass Works, Corning, N.Y.

[21] Appl. No.: 782,626

[22] Filed: Mar. 30, 1977

[30] Foreign Application Priority Data

Apr. 9, 1976  France ............................. 76 10507

[51] Int. Cl.$^2$ ............................................. C03C 3/10
[52] U.S. Cl. ................................................. 106/53
[58] Field of Search ..................................... 106/53

[56] References Cited

U.S. PATENT DOCUMENTS

| 2,736,714 | 2/1956 | Tiede | 106/53 |
|---|---|---|---|
| 2,830,000 | 4/1958 | Labino | 106/53 |
| 2,946,704 | 7/1960 | King et al. | 106/53 |
| 3,238,151 | 1/1966 | Kim | 106/53 |
| 3,854,964 | 12/1974 | Thomas et al. | 106/53 |
| 3,973,976 | 8/1976 | Boyd | 106/53 |
| 4,018,613 | 4/1977 | Martin | 106/53 |

*Primary Examiner*—Winston A. Douglas
*Assistant Examiner*—Mark Bell
*Attorney, Agent, or Firm*—Clinton S. Janes, Jr.; Clarence R. Patty, Jr.

[57] ABSTRACT

This invention is concerned with the production of glasses especially suitable for the encapsulation of semiconductor devices and, in particular, for the encapsulation of germanium and silicon diodes. The glasses have a low softening point, i.e., less than about 550° C., are readily sealable to Dumet, and exhibit a viscosity at the liquidus of at least 20,000 poises. The glasses have compositions within the $K_2O$-$PbO$-$B_2O_3$-$SiO_2$ system, are essentially free from $Li_2O$, $Na_2O$, $Al_2O_3$, and $TiO_2$, and demonstrate a mismatch in thermal expansion with Dumet at about 400° C. of no more than about 200 PPM.

1 Claim, No Drawings

GLASS FOR ENCAPSULATION OF DIODES

BACKGROUND OF THE INVENTION

The glasses most used for the encapsulation of germanium and silicon crystal diodes have been Corning 0120 glass and Corning 8870 glass, the compositions of which are tabulated below in Table I. Table I also reports the softening point (S.P.), coefficient of thermal expansion (Exp.) over the range 0°-300° C. ($\times 10^{-7}/°$ C.), and the viscosity (Vis.) of the glass at its liquidus in poises, as determined in accordance with techniques conventional in the glass art. Sovirel glass D0030, also recorded in Table I, closely approximates the composition of Corning 8870 glass and exhibits similar physical properties. Those glasses seal well to the Dumet metal leads customarily employed with such diodes. Dumet consists of a nickel-iron core enclosed in a copper sheath and demonstrates a coefficient of thermal expansion over the range of 0°-300° C. of about 80-95 $\times 10^{-7}/°$ C.

TABLE I

|  | 0120 | 8870 | D0030 |
| --- | --- | --- | --- |
| $SiO_2$ | 55.0 | 35 | 34.5 |
| $Al_2O_3$ | 1.45 | — | — |
| $Na_2O$ | 3.60 | — | — |
| $K_2O$ | 8.70 | 5.5 | 5.7 |
| PbO | 29.0 | 59 | 59.4 |
| $As_2O_3$ | 0.25 | 0.5 | 0.4 |
| S.P. | 630° C. | 580° C. | 559° C. |
| Exp. | 89.5 | 91.0 | 93.0 |
| Vis. | >10.6 | 350,000 | 200,000 |

Recent research specifically directed to the encapsulation of germaniun and silicon diodes has been conducted to develop glasses which have lower softening points to thereby reduce the time required for sealing and, in so doing, to increase output. The glass should also be substantially free from $Li_2O$ and $Na_2O$ to avoid any contamination of the germanium or silicon crystal diodes. Furthermore, the viscosity of the glass at the liquidus should be at least 20,000 poises to enable the drawing of tubing by means of the Vello process. The glass enclosures used for encapsulating semiconductor devices are customarily cut from tubing.

SUMMARY OF THE INVENTION

We have found a particular group of glasses within the $K_2O$-PbO-$B_2O_3$-$SiO_2$ composition field, essentially free from $Li_2O$ and $Na_2O$, which will exhibit a softening point below about 550° C., a mismatch in thermal expansion with Dumet at about 400° C. (~setting point of the glass) of no more than about 200 parts per million (PPM), and a viscosity at the liquidus of at least 20,000 poises. The glasses consist essentially, in weight percent on the oxide basis, of about:

|  |  |  |
| --- | --- | --- |
|  | $SiO_2$ | 27-33% |
|  | $K_2O$ | 2-6 |
|  | PbO | 62-70 |
| $K_2O+$ | PbO | 64-72 |
|  | $B_2O_3$ | 1-4 |
|  | $GeO_2$ | 0-4 |
| $SiO_2 + B_2O_3 +$ | $GeO_2$ | 27-33 |
|  | ZnO | 0-4 |
| PbO + | ZnO | 62-70 |

$SiO_2$ comprises the network former. It provides the structure of the glass and probably imparts chemical durability against washing agents. It is responsible for the devitrification phase which is in the $K_2O$-PbO-$SiO_2$ system. $K_2O$ and PbO are modifier oxides, i.e., they lower the softening point and increases the expansion ($K_2O$ is more active then PbO on that score). $B_2O_3$ permits the softening point to be reduced without raising the expansion excessively. Up to about 2% $B_2O_3$ does not appear to change the liquidus, but at 7% $B_2O_3$ the liquidus is raised. Therefore, 4% $B_2O_3$ is deemed to be a practical maximum value. The inclusion of any substantial amount of $Al_2O_3$ and/or $TiO_2$ is to be avoided because their addition unduly lowers the viscosity of the glass and can lead to a reaction with $K_2O$, PbO, and/or $SiO_2$ to cause devitrification.

PRIOR ART

U.S. Pat. No. 2,223,118 discloses a glass suitable for absorbing X-rays and ultra-violet rays. This glass consisted, in weight percent, of 4.52% $K_2O$, 60.35% PbO, 34-78% $SiO_2$, and 0.35% $Sb_2O_3$. Not only is the glass composition outside of the composition ranges of the present invention, but the patent has no teaching regarding the utility of that glass for encapsulating semiconductor devices or for sealing to Dumet.

United States Pat. No. 2,736,714 relates to the production of glass fibers particularly useful in making fabrics for use as shields against X-radiation. The glasses have compositions within the ranges of 1.5-7% $Na_2O$ and/or $K_2O$, 2-5% $Al_2O_3$, 57-65% PbO, and 30-37% $SiO_2$. The sole exemplary composition provided consisted of 3.6% $K_2O$, 3% $Al_2O_3$, 59.1% PbO, and 34.3% $SiO_2$. Again, there is no disclosure or suggestion of any utility for those glasses for encapsulating semiconductor devices or for sealing to Dumet, and the compositions are outside of those operable in the present invention.

United States Patent No. 3,493,405 describes glasses having low enough coefficients of thermal expansion (47-55 $\times 10^{-7}/°$ C. over the range of 0°-300° C.) to allow sealing to molybdenum and Kovar and which are suitable for encapsulating semiconductor devices. Operable glasses for that purpose have compositions within the ranges of 2-8% ZnO, 4-15% $Al_2O_3$, 45-60% PbO, 0-15% $B_2O_3$, 0-1% $Sb_2O_3$, and 25-40% $SiO_2$. Such glasses are not only outside the composition ranges of the instant invention, but the coefficients of thermal expansion thereof are far too low to be suitable for sealing to Dumet.

United States Application Ser. No. 655,871, filed Feb. 6, 1976, now U.S. Pat. No. 4,018,613, in the name of Francis W. Martin discloses glasses suitable for encapsulating diodes and capable of being sealed to Dumet. The glasses consist essentially, by weight on the oxide basis, of 64-66% PbO, 3.5-4% $K_2O$, 27-27.5% $SiO_2$, 1.5-2.5% $Al_2O_3$, and 1.5-2.5% $B_2O_3$. The required presence of $Al_2O_3$ places those glasses outside of the compositions operable in the present invention.

DESCRIPTION OF PREFERRED EMBODIMENTS

Table II lists several glass compositions, expressed to weight percent on the oxide basis, which are operable in the present invention. The actual batch ingredients can comprise any material, either the oxide or other compound, which, when melted together with the other ingredients, will be converted to the desired oxide in the proper proportions. Table II also records the softening point (S.P.) and the viscosity (Vis.) of the glass at the liquidus in poises.

Table II

| | 1 | 2 | 3 | 4 |
|---|---|---|---|---|
| $SiO_2$ | 31 | 29 | 29.63 | 27 |
| $B_2O_3$ | 2 | 2 | 2.0 | 2 |
| $K_2O$ | 4 | 4 | 4.01 | 4 |
| ZnO | — | 2 | — | 4 |
| PbO | 63 | 63 | 64.36 | 63 |
| S.P. | 541° C. | 553° C. | 530° C. | 526° C. |
| Vis. | 35,000 | 30,000 | 25,000 | 20,000 |

Very satisfactory glasses for encapsulating germanium and silicon diodes can be produced consisting essentially solely of $K_2O$, PbO, $B_2O_3$, and $SiO_2$. However, to alter the melting and forming behavior and/or the physical properties of the glass, various compatible metal oxides will frequently be included in minor amounts. ZnO is especially useful in that regard and $GeO_2$, $Y_2O_3$, and $Fe_2O_3$ in individual amounts not exceeding about 4%, with the total thereof not exceeding about 6%, can also be helpful in tailoring particularly desired properties to the glass.

Hence, the ideal glass will contain sufficient modifying oxides (including $K_2O$ and PbO) to insure a low viscosity at the liquidus and a coefficient of thermal expansion to closely match that of Dumet. Metal oxides such as $Al_2O_3$ and $TiO_2$ which hazard reaction with $K_2O$ and/or PbO and/or $SiO_2$ to cause devitrification within the glass will be avoided. Finally, $Li_2O$ and $Na_2O$ will also be avoided since they can contaminate the germanium or silicon crystals.

We claim:

1. A glass suitable for the encapsulation of germanium or silicon crystal diodes exhibiting a softening point below about 550° C., a mismatch in thermal expansion with Dumet at about 400° C. of no more than about 200 PPM, and a viscosity at the liquidus of at least 20,000 poises consisting essentially, in weight percent on the oxide basis, of about

| | |
|---|---|
| $SiO_2$ | 27–33 |
| $K_2O$ | 2–6 |
| PbO | 62–70 |
| $K_2O$ + PbO | 64–72 |
| $B_2O_3$ | 1–4 |
| $GeO_2$ | 0–4 |
| $SiO_2$ + $B_2O_3$ + $GeO_2$ | 27–33 |
| ZnO | 0–4 |
| PbO + ZnO | 62–70 | and being essentially free from $Li_2O$, $Na_2O$, $Al_2O_3$, and $TiO_2$.

* * * * *

UNITED STATES PATENT AND TRADEMARK OFFICE
CERTIFICATE OF CORRECTION

PATENT NO. : 4,076,543

DATED : February 28, 1978

INVENTOR(S) : Pascal A. J. Joly and Jean-Claude A. H. Prat

It is certified that error appears in the above-identified patent and that said Letters Patent are hereby corrected as shown below:

Column 2, line 1, "increases" should be -- increase --.

Column 3, Table II, Example 2, "553°C." should be -- 533°C. --.

*Signed and Sealed this*

*Twenty-second* Day of *August 1978*

[SEAL]

Attest:

RUTH C. MASON
*Attesting Officer*

DONALD W. BANNER
*Commissioner of Patents and Trademarks*